United States Patent

Schmidbauer et al.

Patent Number: 6,136,709
Date of Patent: Oct. 24, 2000

[54] METAL LINE DEPOSITION PROCESS

[75] Inventors: Sven Schmidbauer, Dresden, Germany; Stefan J. Weber, Fishkill, N.Y.; Peter Weigand, Unterhaching, Austria; Larry Clevenger, LaGrangeville; Roy Iggulden, Newburgh, both of N.Y.

[73] Assignees: Infineon Technologies North America Corp., San Jose, Calif.; International Business Machines Corporation, Armonk, N.Y.

[21] Appl. No.: 09/413,265

[22] Filed: Oct. 6, 1999

[51] Int. Cl.⁷ .................. H01L 21/24; H01L 21/4763
[52] U.S. Cl. .............. 438/688; 438/622; 438/679; 438/687; 438/685
[58] Field of Search .................. 438/687, 688, 438/686, 679, 622, 625, 637, 642, 644, 650, 685, 669, 660, 643, 636

[56] References Cited

U.S. PATENT DOCUMENTS

| | | | |
|---|---|---|---|
| 5,071,791 | 12/1991 | Inoue et al. | 438/660 |
| 5,108,951 | 4/1992 | Chen et al. | 438/643 |
| 5,407,863 | 4/1995 | Katsura et al. | 438/660 |
| 5,807,760 | 9/1998 | Buckfeller et al. | 438/636 |

*Primary Examiner*—Charles Bowers
*Assistant Examiner*—Thanhha Pham
*Attorney, Agent, or Firm*—Donald B. Paschburg

[57] ABSTRACT

A method for depositing metal lines for semiconductor devices, in accordance with the present invention includes the steps of providing a semiconductor wafer including a dielectric layer formed on the wafer, the dielectric layer having vias formed therein and placing the wafer in a deposition chamber. The method further includes depositing a metal on the wafer to fill the vias wherein the metal depositing is initiated when the wafer is at a first temperature and the depositing is continued while heating the wafer to a target temperature which is greater than the first temperature.

28 Claims, 5 Drawing Sheets

METAL LINE DEPOSITION PROCESS

BACKGROUND

1. Technical Field

This disclosure relates to semiconductor fabrication and more particularly, to a deposition process for forming metal lines in a time efficient and reliable manner.

2. Description of the Related Art

Semiconductor devices, such as semiconductor memories, processors, application specific integrated circuits and the like, include layers of conductive lines used to interconnect components on the devices. Conductive or metal lines are often formed on upper levels of a semiconductor device. These metal lines are typically connected by contacts through vias to underlying devices or other metal lines.

In a conventional method, an Aluminum (Al) metal line deposition includes a two step process. This process is characterized by a cold-hot process. This process is extremely slow having a throughput of only about 22 wafers per hour for a two physical vapor deposition Al chamber mainframe. The process includes two depositions (cold and hot). The first (cold) deposition suffers from the disadvantage of running unchucked. This means that there is no possibility to check whether the wafer is sitting correctly on a chuck which secures the wafer in a processing chamber. If the wafer is not placed correctly on the chuck, the chuck could get deposited on and ruined. This is disadvantageous since an electrostatic chuck can cost about $80,000.

Another problem with the conventional method is the heat up time needed in between the two Al depositions. After the cold Al deposition, the wafer is heated. During that time, a thin $Al_3O_2$ layer may be formed on the previously deposited Al. This decreases the via filling properties.

The cold-hot process sequence may be employed as a so-called sprint approach. This means that a via has to get filled and concurrently a planar Al film has to get deposited. The planar Al film is then etched for structuring metal lines.

The requirements for the Al deposition include the following:

1. vias formed in a dielectric (oxide) layer which are typically tapered must get filled reliably;
2. a planar (low topography) Al film must be formed on top of the dielectric layer; and
3. a temperature budget for semiconductor processing must be maintained (i.e., little or no influence on sub lying metal lines).

To achieve this, the two step Al deposition process was developed. The two step process begins with a cold step which uses high sputter power and runs at low temperatures. This ensures that the vias are getting filled (i.e., small Al grains and no overhangs at the top edge of the vias), and that no voids are formed. Before the second (hot) Al deposition step starts, the wafer temperature gets increased up to 350° C. This second Al deposition process runs at low power to ensure that the Al film gets planarized during deposition. This Al deposition sequence is not a reflow process. Reflow processes typically run at much higher temperatures and were developed for filling more aggressive (higher aspect ratio) via structures. The hot Al deposition process deposition therefore has to fulfill different requirements and is optimized for tapered via fill and planar Al deposition on top of a dielectric layer, as described.

As mentioned above, the conventional two-step deposition process is very slow (e.g., a 192 second process time, and 11/22 wafers/hour for a one/two chamber system). Due to the relatively long Al deposition time of 192 seconds, a small amount of $TiAl_3$ forms which increases contact resistance and decreases the electromigration lifetime.

Therefore, a need exists for a deposition process which increases throughput without sacrificing performance and reliability.

SUMMARY OF THE INVENTION

A method for depositing metal lines for semiconductor devices, in accordance with the present invention, includes the steps of providing a semiconductor wafer including a dielectric layer formed on the wafer. The dielectric layer has vias formed therein. The wafer is placed in a deposition chamber. The method further includes depositing a metal on the wafer to fill the vias wherein the metal depositing is initiated when the wafer is at a first temperature and the depositing is continued while heating the wafer to a target temperature which is greater than the first temperature.

A method for depositing metal lines and contacts for semiconductor devices, in accordance with the present invention includes providing a semiconductor wafer including a dielectric layer formed on the wafer. The dielectric layer has vias formed therein, and the vias include vias in communication with line openings. The steps of placing the wafer on a thermal surface in a deposition chamber and heating the wafer to a first temperature by employing the thermal surface are included. Depositing a metal on the wafer to concurrently fill the vias and the line openings, the metal depositing is initiated when the wafer is at the first temperature and the depositing is continued while heating the wafer to a target temperature which is greater than the first temperature.

Another method for depositing metal lines for semiconductor devices, in accordance with the present invention, includes the steps of providing a semiconductor wafer including a dielectric layer formed on the wafer, the dielectric layer having vias formed therein and placing the wafer in a deposition chamber by securing the wafer to a thermal surface by employing chucks. The wafer is preheated for a first amount of time by employing the thermal surface. Depositing a metal on the wafer to fill the vias, the metal depositing is initiated when the first amount of time has elapsed and the depositing is continued while heating the wafer to a target temperature which is greater than the first temperature.

In other methods, the metal may include one or more of Aluminum, Tungsten, Gold and Copper. If the metal includes Aluminum, the first temperature may be about 150 degrees Celsius and the target temperature may about 350 degrees Celsius. The step of placing the wafer in a deposition chamber may include the step of securing the wafer with chucks prior to initiating the depositing step. The step of placing the wafer in a deposition chamber may include the step of placing the wafer on a thermal surface for heating. The step of placing the wafer on a thermal surface for heating may include the step of adjusting a temperature of the thermal surface to control the wafer temperature during the depositing step. The method may further include the step of etching the metal on a surface of the wafer to form metal lines. The depositing step is preferably completed in less than 110 seconds. If the metal includes Aluminum, the first amount of time may be between about 25 seconds to about 30 seconds and the target temperature is about 350 degrees Celsius. The step of preheating the wafer may include the step of confirming a position of the wafer in the chamber during the first amount of time.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a one step metal deposition process for semiconductor devices. The present invention provides many advantages over the prior art. Some of these advantage include the following:

1) High throughput (shorter process times, which result in a higher throughput);
2) Wafer detection is provided since the wafer is chucked before the deposition begins;
3) Less TiAl$_3$ formation due to shorter deposition times;
4) No pause between Al deposition, therefore no chance for native Al oxide to form in between depositions.

These benefits are accompanied with improved electrical results, such as reduced contact resistance and even improved reliability results.

Figure 1:
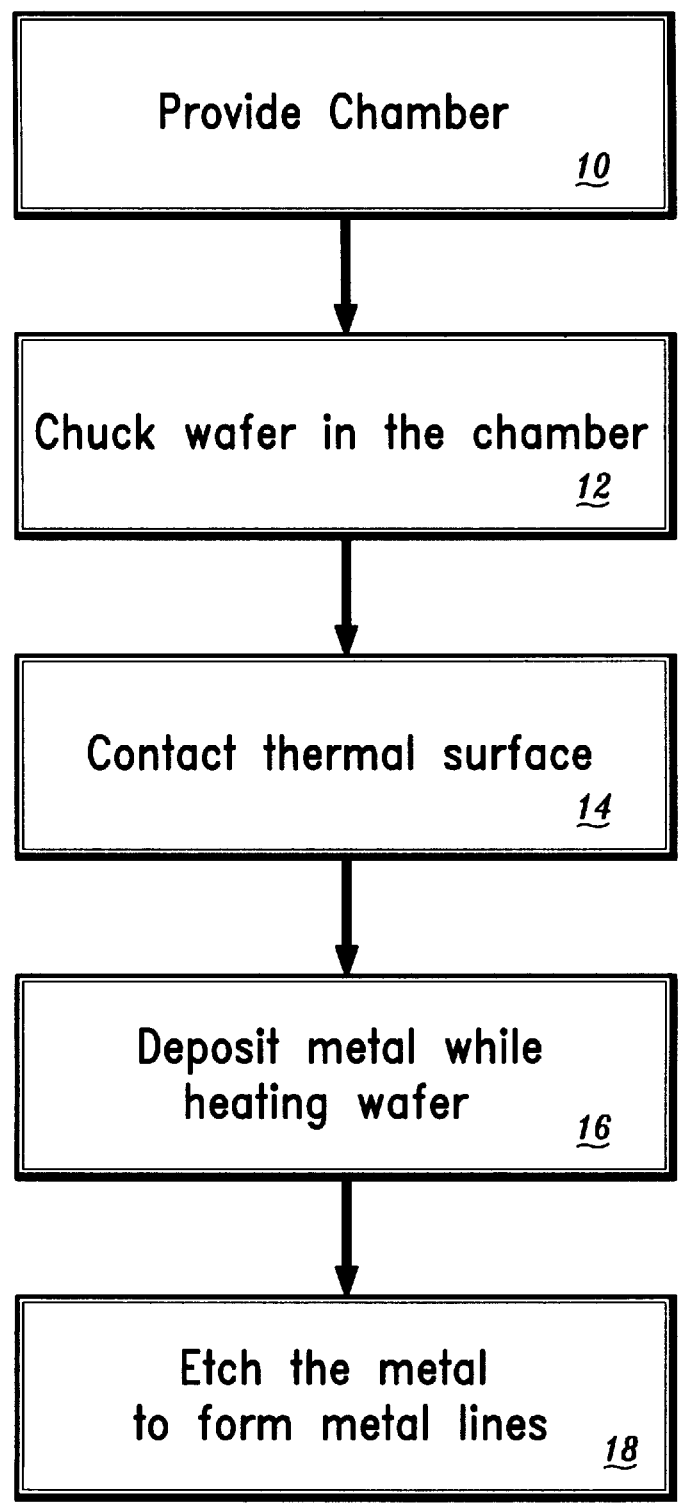
FIG. 1 is a flow diagram showing a method for forming metal lines and contacts in accordance with the present invention.
Figure 2:
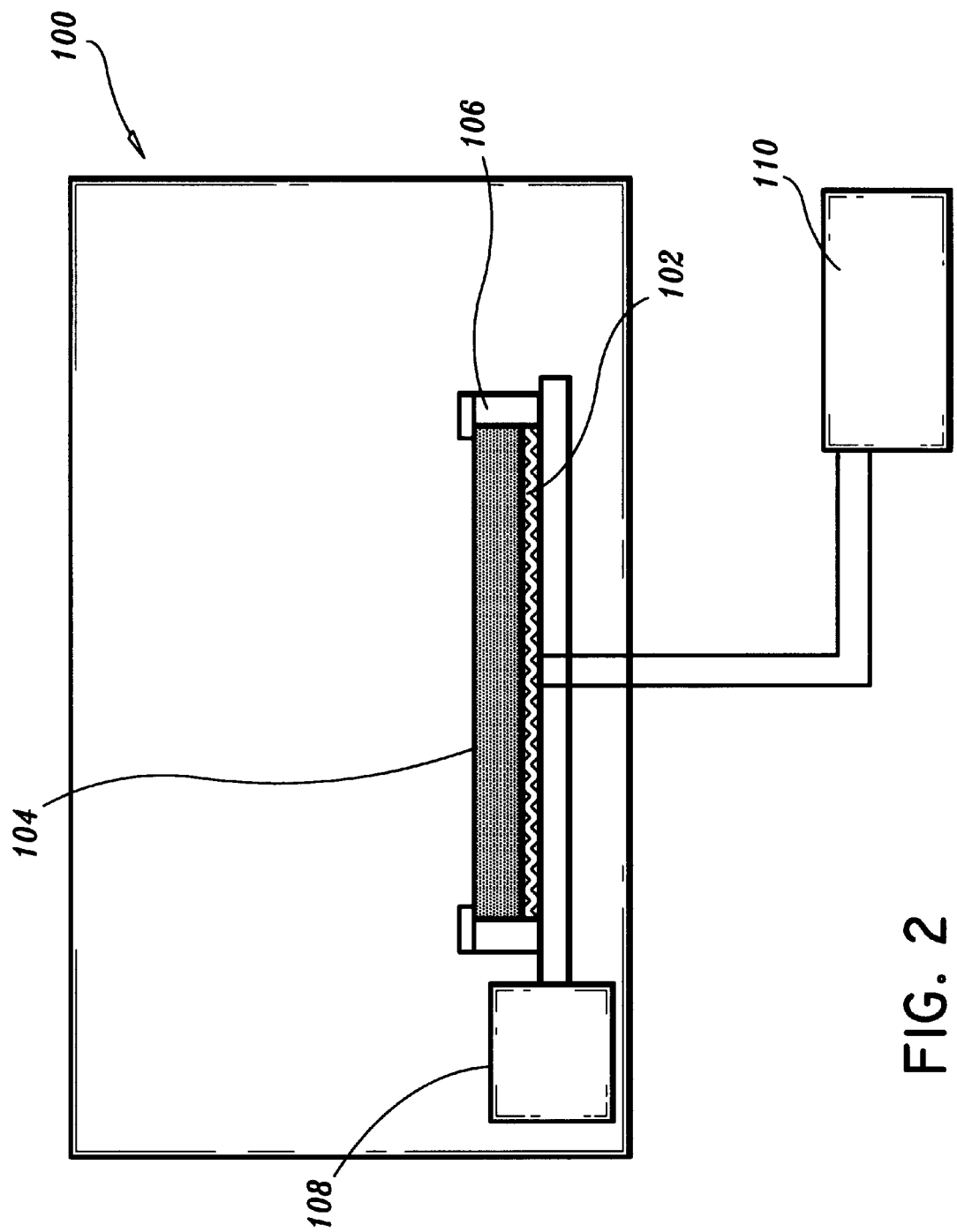
FIG. 2 is a schematic diagram showing a processing chamber for use in accordance with the present invention.

Referring now in specific detail to the drawings in which like reference numerals identify similar or identical elements throughout the several views, and initially to FIG. 1, an illustrative method for forming metal lines in accordance with the present invention is shown. In block 10, a processing chamber is provided. As shown in FIG. 2, a processing chamber 100 may be a standard processing chamber such as an Endura 5500 model available commercially from Applied Materials, Inc. or an INOVA available commercially from Novellus, Inc. Other models may be employed as well. Chamber 100 includes a thermal surface 102 employed to alter the temperature of a wafer 104 installed thereon. Thermal surface 102 may include a chuck 106 for securing wafer 104 thereon. Chuck 106 may include an electrostatic chuck (ESC) or a clamp.

Chuck 106 preferably works in conjunction with a positioning system 108. Positioning system 108 provides information about the position of wafer 104. Chamber 100 includes other components employed for physical vapor deposition processes, for example gas supplies and valves, temperature and pressure controls and instruments, process timing devices, etc. In one embodiment, thermal surface 102 includes a temperature controller 110 which permits a thermal gradient of thermal surface to be programmed or set in accordance with a desired thermal profile. For example, in one embodiment, thermal surface 102 is maintained at a constant temperature (e.g., about 350 degrees Celsius). In another embodiment, thermal surface 102 is programmed to increase its temperature over a given period of time at a given gradient. For example, the gradient could be a linear gradient, an exponential gradient or any other relationship which can be programmed into temperature controller.

In block 12 of FIG. 1, a wafer to be processed is chucked (in chucks 106, see FIG. 2) in preparation for processing. In block 14, the wafer is brought into contact with a thermal surface and the thermal surface is activated to begin heating the wafer. In a preferred embodiment heating is applied for between about 25 to about 30 seconds or until the wafer approaches about 150 degrees Celsius. These times and temperatures may be adjusted according to the deposition process and metal to be deposited, the wafer used and the design of the semiconductor device. A preferred process is described in a commonly assigned U.S. application Ser. No. (TBD) (Attorney Docket Number: 98E9290), entitled HEAT-UP TIME REDUCTION BEFORE METAL DEPOSITION and incorporated herein by reference.

During this heat up time, the position of the wafer is confirmed and adjusted if necessary. In the prior art, the wafer would go unchucked during an initial cold deposition. However, as described the present invention, the wafer is chucked from the onset obviating the concern of damaging the chucks due to deposition of sputtered metal. It is to be understood that the wafer is preferably placed in a single chamber for all processing steps to avoid additional handling of the wafer and to reduce process time lost by transporting and securing the wafer in another position.

In block 16, a physical vapor deposition (PVD) process is initiated. In a preferred embodiment, the PVD process includes sputtering. The PVD process may include the deposition of metals, such as Aluminum (Al), Tungsten (W), Copper (Cu), Gold (Au), or other metals. For simplicity, the present invention will illustratively be described for depositing Al metal lines on a semiconductor wafer.

Advantageously in accordance with the present invention, a seed layer deposition (small grain size, good nucleation) begins to form instantly as deposition begins. As the wafer begins to heat up (in accordance with a constant heating temperature of thermal surface or by a temperature gradient on thermal surface) and eventually reaches a set point (or target) temperature, for example, about 350 degrees Celsius, deposition of the metal continues forming contacts and a metal layer on top of a dielectric layer. Preferably, the contacts and metal lines are formed concurrently. As the temperature, increases warmer metal continues to be deposited on top of the smaller grain-sized metal deposited earlier. The warmer metal deposition advantageously provides improved planarization properties.

In block 18, the later (warmer) deposited metal can be planarized and etched to form metal lines on the surface of the dielectric layer, and contacts are formed in vias in or through the dielectric layer.

In accordance with the present invention, for Al, the deposition process needs between about 70 seconds to about 110 seconds in deposition time to form metal lines and contacts concurrently. This is a significant reduction over the conventional deposition process which requires over 190 seconds to complete. With the reduced deposition times throughput is accordingly increased. For example, throughput is improved to about 22 wafers per hour for a single Al physical vapor deposition chamber and about 35 wafers per hour for two Al PVD chambers.

Figure 3:
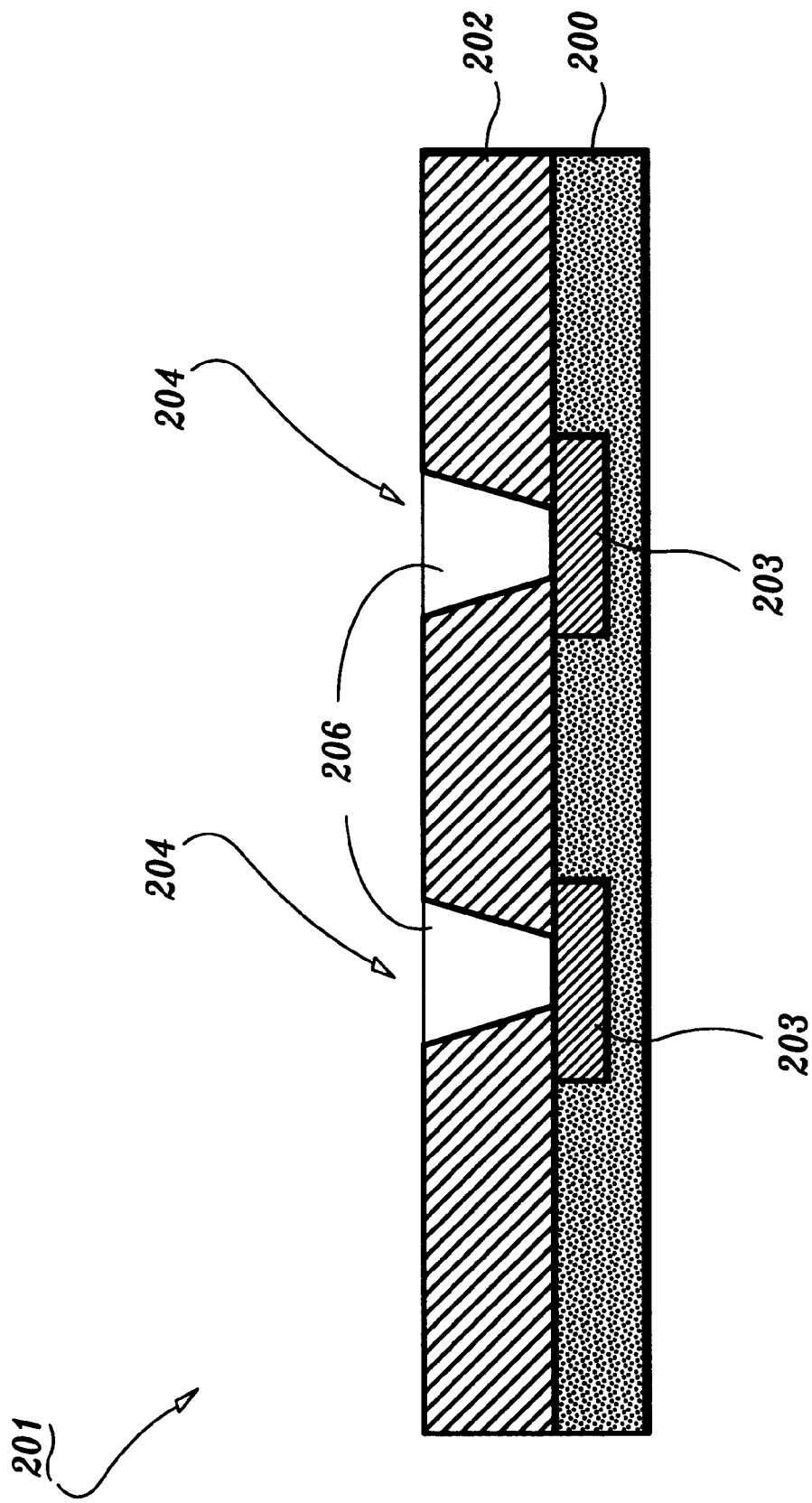
FIG. 3 is a partial cross-sectional view of a wafer showing vias formed in a dielectric layer for deposition of a metal in accordance with the present invention.

Referring to FIG. 3, a semiconductor wafer 201 is shown. Wafer 201 may include a semiconductor memory chip, such as a dynamic random access memory (DRAM), static random access memory (SRAM), a read only memory (ROM), embedded DRAM/SRAM, or the like. Wafer 201 may also include a processor chip, or an application specific integrated circuit (ASIC) chip, etc. A target layer 200 includes a conductive component or underlying metal line or layer, or target layer 200 includes a target conductor 203, such as a substrate, for example, a semiconductor substrate, having diffusion regions formed therein or a conductive layer or conductive line formed thereon. A dielectric layer 202 is formed on target layer 200. Dielectric layer 202 may include an oxide, a nitride, an organic layer, such as a resist or polyamide, or other suitable dielectric materials. Dielectric layer 202 is patterned to form trenches 204. Trenches 204 may include contact holes or vias 206 and/or conductive line openings. Other structures may be formed in accordance with the present invention. For example, conductive lines may be formed in trenches in dielectric layer 202. In a preferred method vias 206 are formed in trenches 204 while metal line are formed on the surface of dielectric layer 202. Vias 206 expose portions of the underlying conductive materials of target layer 200.

Figure 4:
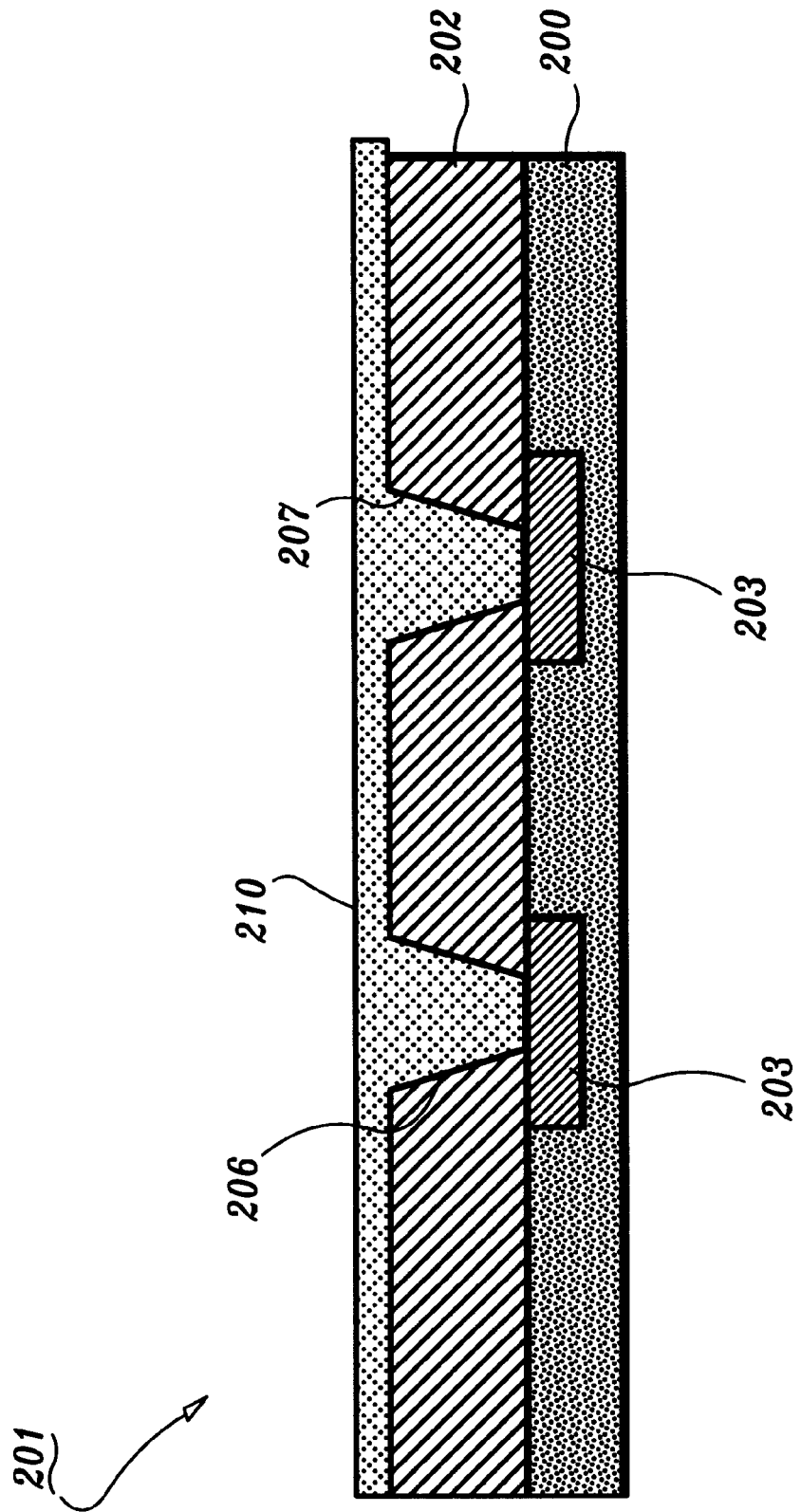
FIG. 4 is a partial cross-sectional view of the wafer of FIG. 3 showing the vias filled with a metal deposited in a single deposition process in accordance with the present invention.

Referring to FIG. 4, wafer 201 is placed in a PVD chamber in accordance with the present invention. A metal 210 is deposited in vias 206 and on dielectric layer 202 by employing the one step process of the present invention. Alternately, a metal liner 207 may be deposited prior to metal 210 deposition. For example, liner 207 may include Ti/TiN, Ta, W or other materials. In accordance with the present invention. Wafer 201 is gradually heated from a "cold" temperature to a "hot" temperature during the deposition process. In accordance with one aspect of the present invention, the temperature of thermal surface 102 (FIG. 2) is adjusted (e.g., by changing the temperature of the thermal surface) to achieve optimal results for the given deposition process. During the heating process, metal 210 is deposited in trenches 204 (which may include vias 206 or other structures). Metal 210 is continuously deposited until open trenches 204 are filled and metal 210 covers top surfaces of dielectric layer 202. As described above, since the present invention provides a continuous deposition, oxides, for example, $Al_3O_2$ in the case of Al deposition, do not have a chance to form between portions of metal 210. Also, since deposition times are reduced, the chances for the formation of undesirable compounds, for example $TiAl_3$ in the case of Al deposition, are significantly reduced.

Figure 5:
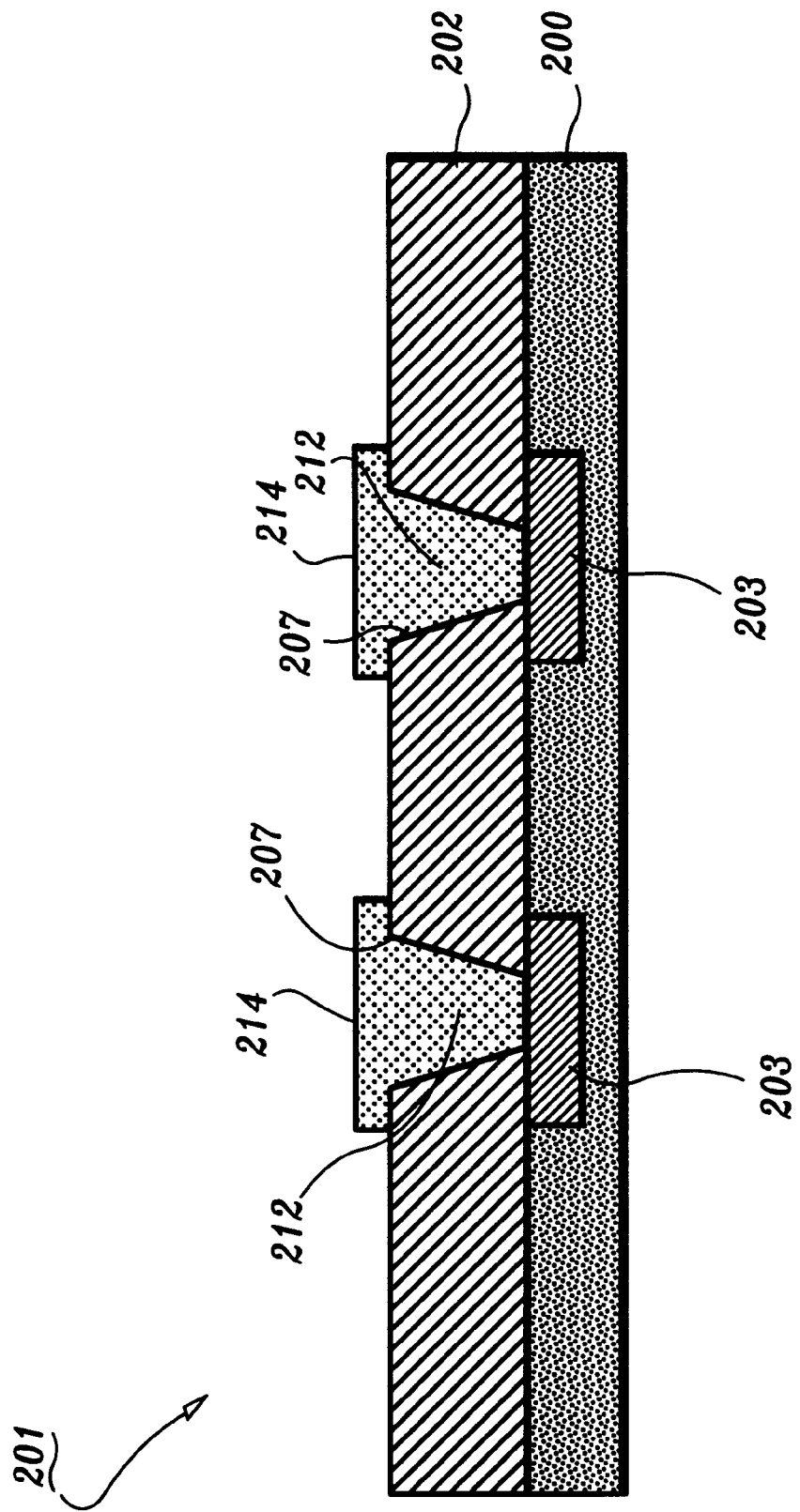
FIG. 5 is a partial cross-sectional view of the wafer of FIG. 4 showing the metal patterned on a top surface of the wafer in accordance with the present invention.

Referring to FIG. 5, metal 210 formed on the top surfaces of dielectric layer 202 is etched to form metal lines 214. A planarization process may be employed prior to etching to provide a better metal surface for later processing. Contacts 212 and metal lines 214 are now provided in accordance with the present invention.

In accordance with the present invention, contact resistances for structures formed in FIG. 5 provided about a 10% improvement over the prior art. Further, chain currents provided about a 5% improvement over the prior art.

Having described preferred embodiments for an improved deposition process (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for depositing metal lines for semiconductor devices comprising the steps of:

providing a semiconductor wafer including a dielectric layer formed on the semiconductor wafer, the dielectric layer having vias formed therein;

placing the semiconductor wafer in a deposition chamber on a thermal surface;

depositing a metal on the semiconductor wafer in a single process which fills the vias wherein the metal depositing is initiated when the semiconductor wafer is at a first temperature and the metal depositing is continued while heating the semiconductor wafer to a target temperature which is greater than the first temperature; and controlling an intermediate temperature of the semiconductor wafer between the first temperature and the target temperature by programming a thermal gradient in the thermal surface on which the semiconductor wafer is mounted in the deposition chamber.

2. The method as recited in claim 1, wherein the metal includes one of Tungsten, Gold and Copper.

3. The method as recited in claim 1, wherein the metal includes Aluminum and the first temperature is about 150 degrees Celsius and the target temperature is about 350 degrees Celsius.

4. The method as recited in claim 1, wherein the step of placing the semiconductor wafer in a deposition chamber includes a step of securing the semiconductor wafer with chucks prior to initiating the depositing step and maintaining the semiconductor wafer in a secured position throughout the step of depositing a metal.

5. The method as recited in claim 1, further comprising a step of etching the metal on a surface of the semiconductor wafer to form metal lines.

6. The method as recited in claim 1, wherein the step of depositing metal is completed in less than 110 seconds.

7. The method as recited in claim 1, wherein the thermal gradient is non-linear.

8. The method as recited in claim 7, wherein the thermal gradient is exponential.

9. The method as recited in claim 1, wherein the thermal gradient is linear.

10. A method for depositing metal lines and contacts for semiconductor devices comprising the steps of:

providing a semiconductor wafer including a dielectric layer formed on the semiconductor wafer, the dielectric layer having vias formed therein;

placing the semiconductor wafer on a thermal surface in a deposition chamber;

heating the semiconductor wafer to a first temperature by employing the thermal surface;

depositing a metal on the semiconductor wafer to concurrently fill the vias and cover a top surface of the dielectric layer wherein the metal depositing is initiated when the semiconductor wafer is at the first temperature and the metal depositing is continued while heating the semiconductor wafer to a target temperature which is greater than the first temperature; and controlling an intermediate temperature of the semiconductor wafer between the first temperature and the target temperature by programming a thermal gradient in the thermal surface on which the semiconductor wafer is mounted in the deposition chamber.

11. The method as recited in claim 10, wherein the metal includes one of Tungsten, Gold and Copper.

12. The method as recited in claim 10, wherein the metal includes Aluminum and the first temperature is about 150 degrees Celsius and the target temperature is out 350 degrees Celsius.

13. The method as recited in claim 10, wherein the step of placing the semiconductor wafer on a thermal surface in a deposition chamber includes a step of securing the semiconductor wafer with chucks prior to initiating the metal depositing step and maintaining the semiconductor wafer in a secured position throughout the step of depositing a metal.

14. The method as recited in claim 10, further comprising a step of etching the metal on the top surface of the dielectric layer to form metal lines which are electrically connected to the vias.

15. The method as recited in claim 10, wherein the step of depositing a metal is completed in less than 110 seconds.

16. The method as recited in claim 10, wherein the thermal gradient is non-linear.

17. The method as recited in claim 16, wherein the thermal gradient is exponential.

18. The method as recited in claim 10, wherein the thermal gradient is linear.

19. A method for depositing metal lines for semiconductor devices comprising the steps of:

provinding a semiconductor wafer including a dielectric layer formed on the semiconductor wafer, the dielectric layer having vias formed therein;

placing the semiconductor wafer in a deposition chamber by securing the semiconductor wafer to a thermal surface by employing chucks;

preheating the semiconductor wafer for a first amount of time by employing the thermal surface;

depositing a metal on the semiconductor wafer to fill the vias wherein the metal depositing is initiated when the first amount of time has elapsed and the metal depositing is continued while heating the semiconductor wafer to a target temperature which is greater than the first temperature; and controlling an intermediate temperature of the semiconductor wafer between the first temperature and the target temperature by programming a thermal gradient in the thermal surface on which the semiconductor wafer is mounted in the deposition chamber.

20. The method as recited in claim 19, wherein the metal includes one of Tungsten, Gold and Copper.

21. The method as recited in claim 19, wherein the metal includes Aluminum and the first amount of time is between about 25 seconds to about 30 seconds and the target temperature is about 350 degrees Celsius.

22. The method as recited in claim 19, wherein the step of placing the semiconductor wafer in a deposition chamber includes the step of securing the semiconductor wafer with chucks prior to initiating the metal depositing step and maintaining the semiconductor wafer in a secured position throughout the step of depositing a metal.

23. The method as recited in claim 19, further comprising a step of etching the metal on a top surface of the dielectric layer to form metal lines which are electrically connected to the metal in the vias.

24. The method as recited in claim 19, wherein the step of depositing a metal is completed in less than 110 seconds.

25. The method as recited in claim 19, wherein the step of preheating the semiconductor wafer includes the step of confirming a position of the semiconductor wafer in the chamber during the first amount of time.

26. The method as recited in claim 19, wherein the thermal gradient is non-linear.

27. The method as recited in claim 26, wherein the thermal gradient is exponential.

28. The method as recited in claim 19, wherein the thermal gradient is linear.

* * * * *